(12) United States Patent
Kudo et al.

(10) Patent No.: US 7,041,586 B2
(45) Date of Patent: May 9, 2006

(54) SEMICONDUCTOR DEVICE HAVING A MULTILAYER INTERCONNECTION STRUCTURE

(75) Inventors: Hiroshi Kudo, Kawasaki (JP);
Masanobu Ikeda, Kawasaki (JP);
Kenichi Watanabe, Kawasaki (JP);
Yoshiyuki Ohkura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 184 days.

(21) Appl. No.: 10/105,190

(22) Filed: Mar. 26, 2002

(65) Prior Publication Data

US 2002/0151190 A1    Oct. 17, 2002

Related U.S. Application Data

(63) Continuation of application No. 09/274,976, filed on Mar. 23, 1999, now Pat. No. 6,417,116.

(30) Foreign Application Priority Data

Mar. 24, 1998    (JP)    ................... 10-075938

(51) Int. Cl.
*H01L 21/44*    (2006.01)

(52) U.S. Cl. ............ 438/597; 438/618; 438/598; 438/453; 438/624; 438/625; 438/637; 257/642; 257/751; 257/752; 257/759

(58) Field of Classification Search ........... 257/759, 257/760, 751, 752, 758, 642, 643, 773, 774, 257/666; 438/453, 598, 597, 618, 622, 623, 438/624, 625, 634, 637, 638, 666, 687, 769
See application file for complete search history.

(56) References Cited

U.S. PATENT DOCUMENTS

| | | | | |
|---|---|---|---|---|
| 4,678,709 A * | 7/1987 | Tondre et al. | ............... | 428/380 |
| 5,444,023 A * | 8/1995 | Homma | ...................... | 438/631 |
| 5,751,056 A * | 5/1998 | Numata | ...................... | 257/666 |
| 5,821,162 A * | 10/1998 | Yamaha et al. | ............. | 438/623 |
| 5,850,102 A * | 12/1998 | Matsuno | ...................... | 257/635 |
| 5,877,076 A * | 3/1999 | Dai | ............................. | 438/597 |
| 5,882,996 A * | 3/1999 | Dai | ............................. | 438/597 |
| 5,892,269 A * | 4/1999 | Inoue et al. | ................. | 257/634 |
| 5,939,788 A | 8/1999 | McTeer | ...................... | 257/751 |
| 5,965,934 A * | 10/1999 | Cheung et al. | ............. | 257/642 |
| 5,981,374 A * | 11/1999 | Dalal et al. | .................. | 438/624 |
| 5,981,377 A * | 11/1999 | Koyama | ...................... | 438/633 |
| 6,017,813 A * | 1/2000 | Kuo | ............................. | 438/618 |
| 6,030,904 A | 2/2000 | Grill et al. | .................. | 438/781 |
| 6,043,145 A | 3/2000 | Suzuki et al. | ................ | 438/622 |
| 6,051,321 A | 4/2000 | Lee et al. | .................... | 428/447 |
| 6,071,806 A * | 6/2000 | Wu et al. | .................... | 438/622 |
| 6,071,807 A * | 6/2000 | Watanabe et al. | ............ | 438/623 |
| 6,127,256 A * | 10/2000 | Matsuno | ...................... | 438/624 |
| 6,165,899 A | 12/2000 | Matumoto | ................... | 438/638 |

(Continued)

FOREIGN PATENT DOCUMENTS

JP    9-172016    6/1997

*Primary Examiner*—B. William Baumeister
*Assistant Examiner*—Victor V. Yevsikov
(74) *Attorney, Agent, or Firm*—Westerman, Hattori, Daniels & Adrian, LLP

(57) ABSTRACT

A semiconductor device includes a multilayer interconnection structure including an organic interlayer insulation film in which a conductor pattern is formed by a damascene process, wherein the organic interlayer insulation film carries thereon an organic spin-on-glass film.

14 Claims, 18 Drawing Sheets

U.S. PATENT DOCUMENTS

| | | | |
|---|---|---|---|
| 6,180,512 B1 * | 1/2001 | Dai | 438/627 |
| 6,204,168 B1 * | 3/2001 | Naik et al. | 438/638 |
| 6,225,217 B1 * | 5/2001 | Usami et al. | 438/637 |
| 6,420,269 B1 * | 7/2002 | Matsuzawa et al. | 438/693 |
| 6,518,170 B1 * | 2/2003 | Koganei | 438/623 |
| 6,541,396 B1 * | 4/2003 | Kawahara et al. | 438/780 |
| 6,825,132 B1 * | 11/2004 | Inoue et al. | 438/783 |
| 2003/0062627 A1 * | 4/2003 | Naik et al. | 257/774 |

* cited by examiner

SEMICONDUCTOR DEVICE HAVING A MULTILAYER INTERCONNECTION STRUCTURE

This application is a continuation of prior application Ser. No. 09/274,976 filed Mar. 23, 1999 now U.S. Pat. No. 6,417,116 which is hereby incorporated by reference.

BACKGROUND OF THE INVENTION

The present invention generally relates to semiconductor devices and more particularly to a semiconductor device having a multilayer interconnection structure and a fabrication process thereof.

It is well known that the operational speed of a semiconductor device increases according to the scaling law with miniaturization of the semiconductor device. Thus, intensive efforts are being made in the art of semiconductor technology to miniaturize semiconductor devices as much as possible.

Meanwhile, recent highly miniaturized, high-speed semiconductor integrated circuits generally use a multilayer interconnection structure for interconnecting individual semiconductor devices included in the integrated circuit. In such high-speed semiconductor integrated circuits, there occurs a problem of delay in the signals that are transmitted through the interconnection pattern of the multilayer interconnection structure as a result of the existence of stray capacitance.

Thus, in order to eliminate the problem of signal delay in the multilayer interconnection structure, there is a proposal to replace an $SiO_2$ film conventionally used in a multilayer interconnection structure as an interlayer insulation film, by an organic insulation film such as a hydrocarbon film. Further, there is a proposal to replace the Al pattern conventionally used for the interconnection pattern in multilayer interconnection structure by a Cu pattern. By using an organic insulation film having a dielectric constant of typically about 2.5, it is possible to reduce the dielectric constant of the interlayer insulation film as much as 40% as compared with the case of using a conventional $SiO_2$ interlayer insulation film.

When Cu is used for the interconnection pattern in a multilayer interconnection structure, it is necessary to form the interconnection pattern by a damascene process in view of the difficulty of applying a dry etching process to such a Cu pattern.

FIGS. 1A and 1B show the fabrication process of a conventional semiconductor device that uses an organic insulation film for an interlayer insulation film.

Referring to FIG. 1A, a substrate 11, on which various diffusion regions (not shown) are formed, is covered by a hydrocarbon insulation film, such as the SiLK (trade name of Dow Chemical, Inc.) by a spin-coating process, wherein the hydrocarbon insulation film thus formed is patterned to form an interlayer insulation film 12 in which a number of grooves are formed for accommodating interconnection patterns. The interlayer insulation film 12 is then covered by a TiN film 13 deposited by a sputtering process generally with a uniform thickness, and a Cu layer 14 is deposited further on the TiN film 13 by a sputtering process so as to fill the foregoing grooves.

Next, in the step of FIG. 1B, the Cu layer 14 is subjected to a chemical mechanical polishing (CMP) process and the part of the Cu layer 14 locating above the interlayer insulation film 12 is removed. Thereby a structure in which a Cu pattern 14A fills the groove in the interlayer insulation film 12 is obtained as indicated in FIG. 1B.

On the other hand, such a conventional fabrication process of a semiconductor device that includes the CMP process has a problem, as represented in FIG. 1B, in that the organic interlayer insulation film 12 may also be polished together with the Cu layer 14 as a result of the CMP process. When this occurs, the Cu pattern 14A cannot be formed in conformity with the desired design specification.

In order to overcome the foregoing problem, it has also been practiced to form an $SiO_2$ film 12A on the surface of the organic interlayer insulation film 12 by a CVD process as indicated in FIG. 1C. In this case, the CMP process is conducted while using the $SiO_2$ film 12A as a polishing stopper. In the case of polishing the Cu layer 14 by a slurry of $Al_2O_3$, the $SiO_2$ film 12A thus formed is substantially immune to the polishing process, and the Cu pattern 14A and the interlayer insulation film are formed to have a desired thickness.

On the other hand, the structure of FIG. 1C has a drawback in that the $SiO_2$ film 12A on the organic interlayer insulation film 12 has a very large dielectric constant of about 4.0. In such a case, there tends to occur a concentration of electric flux in the $SiO_2$ film 12A and the stray capacitance of the interconnection pattern 14A tends to increase even when the low-dielectric organic interlayer insulation film 12 is used for the multilayer interconnection structure.

Further, the conventional structure of FIG. 1C has a drawback in that there may occur a short-circuit in the interconnection patterns that are formed in the upper layers locating above the interlayer insulation film 12 when the interconnection pattern 14A in the interlayer insulation film 12 is formed to have a large width.

FIGS. 2A–2D show the process of forming two interconnection layers based on the structure of FIG. 1C, wherein those parts corresponding to the parts described previously are designated by the same reference numerals and the description thereof will be omitted.

Referring to FIG. 2A, the Cu layer 14 is formed in the interlayer insulation film 12 so as to fill a groove 12G in the interlayer insulation film 12, and a CMP process is conducted in the step of FIG. 2B in correspondence to the step of FIG. 1B to form the Cu pattern 14A filling the groove 12G.

As indicated in FIG. 2B, such a CMP process inevitably causes a dishing in the interconnection pattern 14A when the width of the groove 12G is large. Thus, when a next interlayer insulation film 15 is formed on the interlayer insulation film 12 thus including the interconnection pattern 14A, there appears a depression 15A on the surface of the interlayer insulation film 15 in correspondence to the dishing of the interconnection pattern 14A as represented in FIG. 2C.

Thus, when a further organic interlayer insulation film 16 is formed on the interlayer insulation film 15 with grooves 16A and 16B formed therein in correspondence to the interconnection pattern 14A as represented in FIG. 2D, Cu patterns 18A and 18B, formed by a deposition of a Cu layer on the interlayer insulation film 16 and a subsequent CMP process so as to fill the grooves 16A and 16B, may be connected with each other by a bridging part 18C of Cu. It should be noted that such a bridging part 18C remains after the CMP process due to the depression 15A of the underlying interlayer insulation film 15 and hence the dishing of the wide interconnection pattern 14A. In such a structure, there occurs a short-circuit between the interconnection pattern 18A and the interconnection pattern 18B.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide a semiconductor device having a multilayer interconnection structure including therein an organic interlayer insulation film and a conductor pattern formed in the organic interlayer insulation film by a damascene process, wherein a polishing stopper layer resistant to a CMP process and having a low dielectric constant is provided on a surface of the organic interlayer insulation film.

Another object of the present invention is to provide a semiconductor device having a multilayer interconnection structure including an organic interlayer insulation film and a conductor pattern formed therein by a damascene process, wherein the problem of short-circuit of the interconnection patterns formed above the foregoing conductor pattern, caused by a dishing of the conductor pattern, is eliminated.

Another object of the present invention is to provide a method of fabricating a semiconductor device, comprising the steps of:

forming an interlayer insulation film on a substrate;

forming an organic spin-on-glass film on said interlayer insulation film;

patterning said organic spin-on-glass film and said interlayer insulation film to form a depression such that said depression penetrates through said organic spin-on-glass film and reaches said interlayer insulation film;

depositing a conductor layer on said organic spin-on-glass film so as to fill said depression; and removing a part of said conductor layer locating above said organic spin-on-glass film by a chemical mechanical polishing process, to form a conductor pattern filling said depression, said chemical mechanical polishing process being conducted while using said organic spin-on-glass film as a polishing stopper.

Another object of the present invention is to provide a semiconductor device, comprising:

a substrate;

an interlayer insulation film formed on said substrate;

another insulation film formed on said interlayer insulation film;

a depression penetrating through said another insulation film and reaching said interlayer insulation film; and a conductor pattern filling said depression;

said another insulation film being formed of an organic spin-on-glass.

According to the present invention, it is possible to form the interlayer insulation film and the conductor pattern to have a desired thickness by merely conducting a CMP process that stops spontaneously at the organic spin-on-glass film. As such an organic spin-on-film has a very low dielectric constant, the problem of concentration of electric flux is avoided effectively and the signal delay associated with the stray capacitance of the multilayer interconnection structure is successfully eliminated.

Table 1 below shows the result of polishing experiments conducted by the inventor of the present invention with regard to the invention noted above. In the experiments, various insulation films including an organic SOG (spin-on-glass) film, a plasma-CVD $SiO_2$ film and a plasma-CVD SiN film, are subjected to a CMP process, wherein the CMP process is conducted under various conditions optimized for polishing various conductor layers including Cu, Al and W.

TABLE 1

|  | [Cu] | [Al] | [W] |
| --- | --- | --- | --- |
| plasma $SiO_2$ film | 120 Å/min | 130 Å/min | 110 Å/min |
| plasma SiN film | 350 | 300 | 240 |
| organic SOG film | 10 | 12 | 13 |

Referring to Table 1, the CMP process was conducted under a condition [Cu] optimized for polishing a Cu layer, a condition [Al] optimized for polishing an Al layer, and a condition [W] optimized for polishing a W layer, for each of a plasma $SiO_2$ film, a plasma SiN film and an organic SOG film, wherein an $Al_2O_3$ slurry was used in combination with an $H_2O_2$ oxidant in the condition [Cu] and in the condition [Al], while an $Al_2O_3$ slurry was used in combination with an oxidant of iron nitrate in the condition [W]. In the condition [Cu], the platen was rotated at a speed of 60 rpm and the polishing was made under a pressure of 4.0 psi. In the condition [Al], the platen was rotated at a speed of 50 rpm and the polishing was made under a pressure of 5.0 psi. In the condition [W], the platen was rotated at a speed of 60 rpm and the polishing was made under a pressure of 5.0 psi.

As can be seen clearly in Table 1, the polishing rate of the organic SOG film is in the order of 10–13 Å/min throughout the conditions [Cu]-[W], while this polishing rate is remarkably smaller than the polishing rate for polishing a plasma $SiO_2$ film or a plasma SiN film. In the case of polishing the organic SOG film, it was further confirmed that the film is substantially free from scratches that are tend to be induced when a plasma-CVD $SiO_2$ film is polished.

The foregoing discovery indicates that the organic SOG film can be used successfully for a polishing stopper in a CMP process.

Another object of the present invention is to provide a method of fabricating a semiconductor device, comprising the steps of:

forming an interlayer insulation film on a substrate;

forming a groove in said interlayer insulation film;

forming a conductor layer on said interlayer insulation film so as to fill said groove;

removing a part of said conductor layer covering said interlayer insulation film by a chemical mechanical polishing process, to form a conductor pattern filling said groove; and applying an insulation film of a liquid form on said interlayer insulation film, such that said insulation film covers said conductor pattern.

Another object of the present invention is to provide a method of fabricating a semiconductor device, comprising the steps of:

forming a first interlayer insulation film on a substrate;

forming a groove in said first interlayer insulation film;

forming a conductor layer on said first interlayer insulation film so as to fill said groove;

removing a part of said conductor layer covering said first interlayer insulation film by a chemical mechanical polishing process, to form a conductor pattern filling said groove;

forming a second interlayer insulation film on said first interlayer insulation film so as to cover said conductor pattern; and planarizing said second interlayer insulation film by a chemical mechanical polishing process.

Another object of the present invention is to provide a semiconductor device, comprising:
a substrate;
a first interlayer insulation film formed on said substrate;
a first depression formed in said first interlayer insulation film;
a first conductor pattern filling said first depression;
a second interlayer insulation film formed on said first interlayer insulation film so as to cover said first conductor pattern, said second interlayer insulation film having a planarized surface;
a second depression formed in said second interlayer insulation film; and
a second conductor pattern filling said second depression.

According to the present invention, the problem of short-circuit occurring in the upper layer interconnection patterns is effectively eliminated even in such a case where there is a dishing in the lower layer interconnection pattern, by planarizing the interlayer insulation film that covers the lower layer interconnection pattern.

Other objects and further features of the present invention will become apparent from the following detailed description when read in conjunction with the attached drawings.

DETAILED DESCRIPTION OF THE PREFERRED EMBODIMENTS

First Embodiment

Figure 1A:
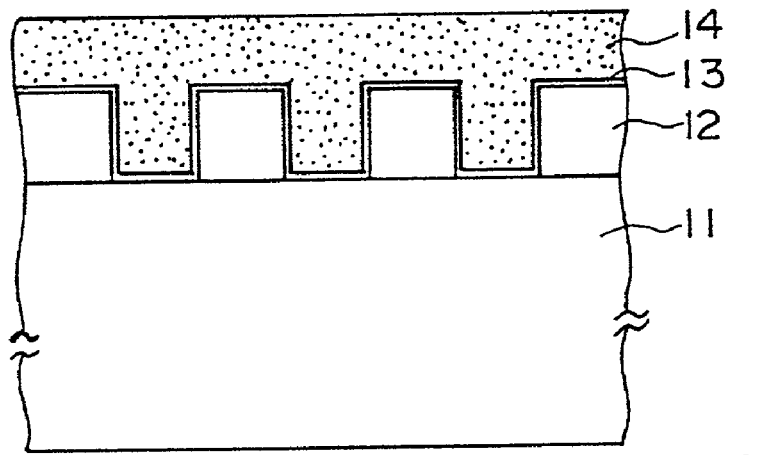
FIGS. 1A–1C are diagrams showing the process of forming a multilayer interconnection structure having a damascene structure.
Figure 1B:
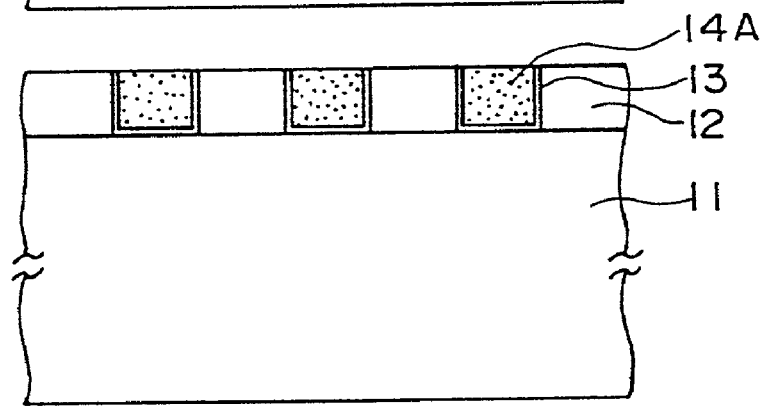
Figure 1C:
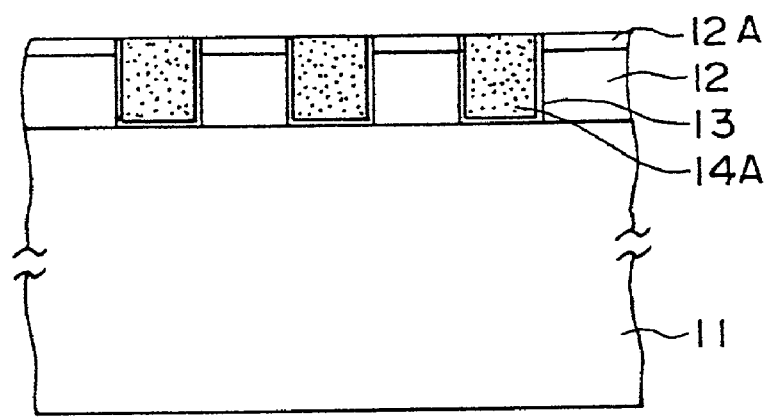
Figure 2A:
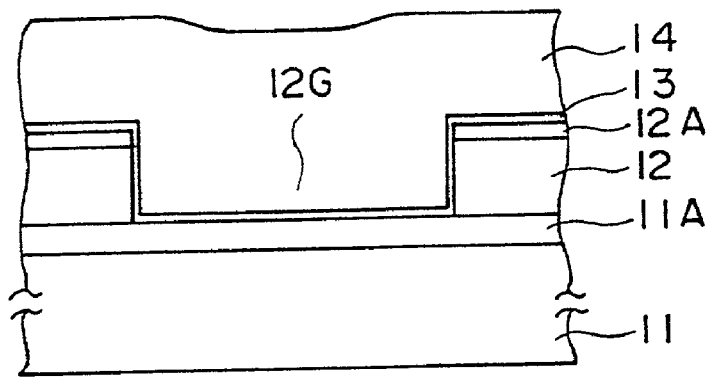
FIGS. 2A–2D are diagrams showing the problem caused in a conventional multilayer interconnection structure having a damascene structure.
Figure 2B:
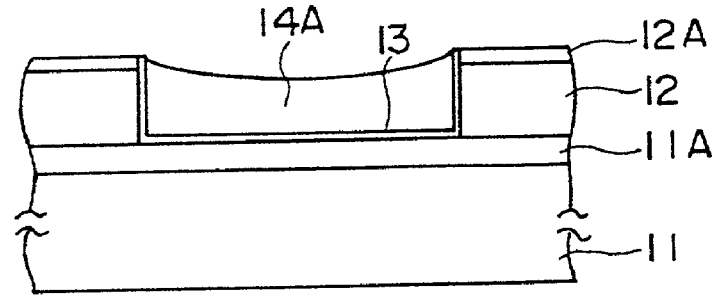
Figure 2C:
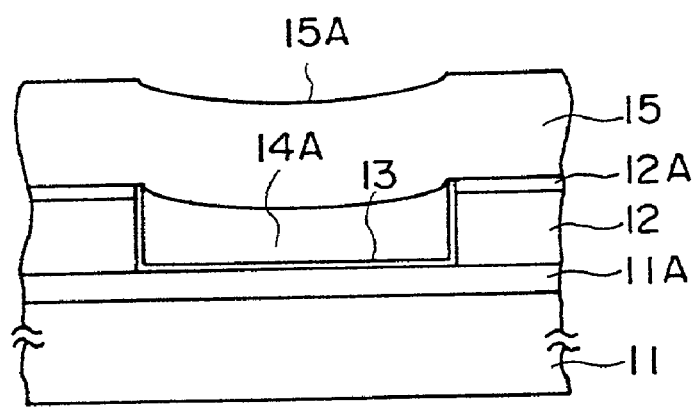
Figure 2D:
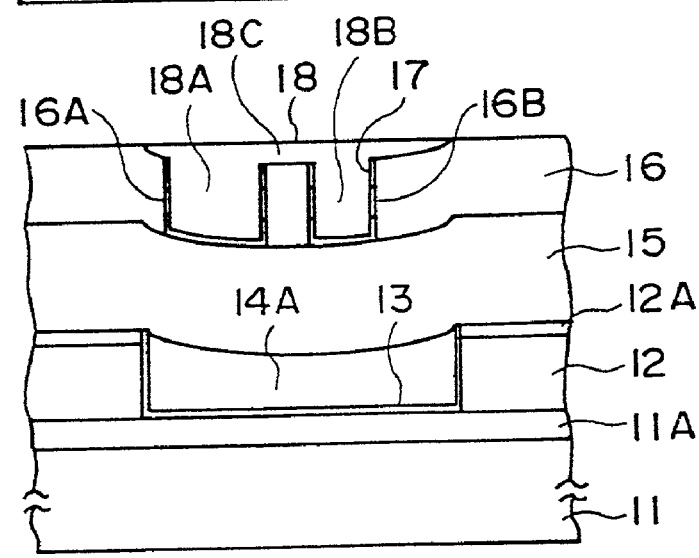
Figure 3A:
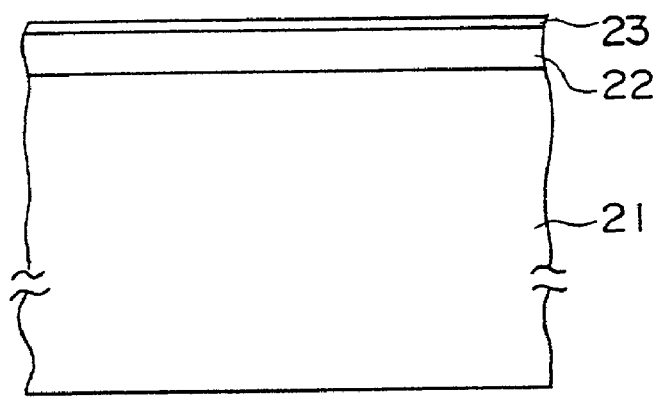
FIGS. 3A–3N are diagrams showing the fabrication process of a semiconductor device according to a first embodiment of the present invention.
Figure 3B:
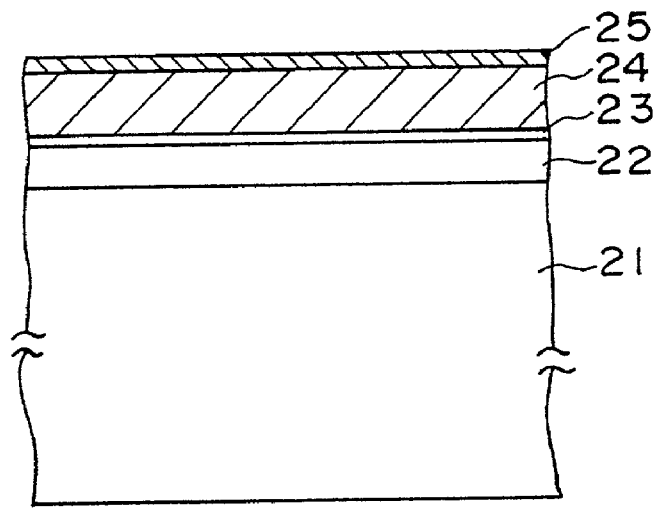
Figure 3C:
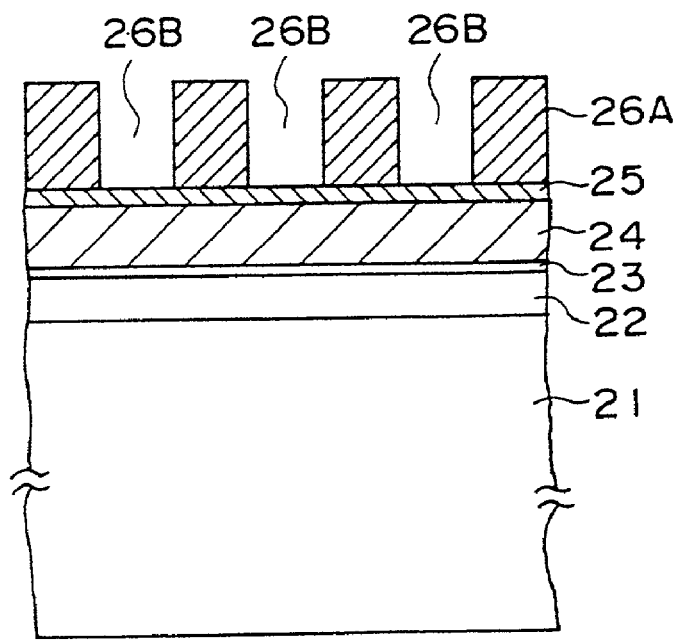
Figure 3D:
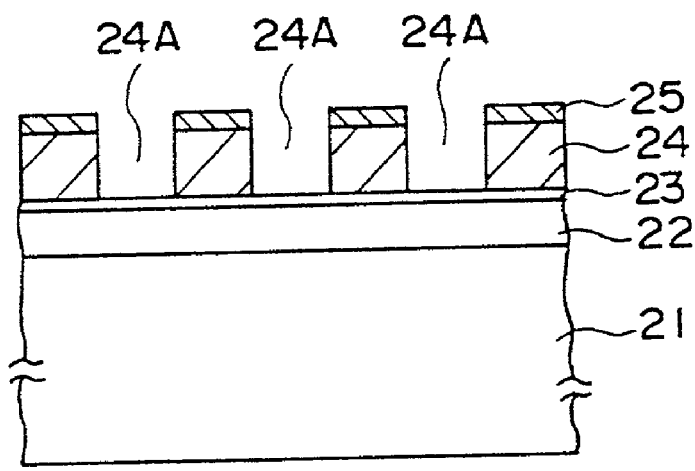
Figure 3E:
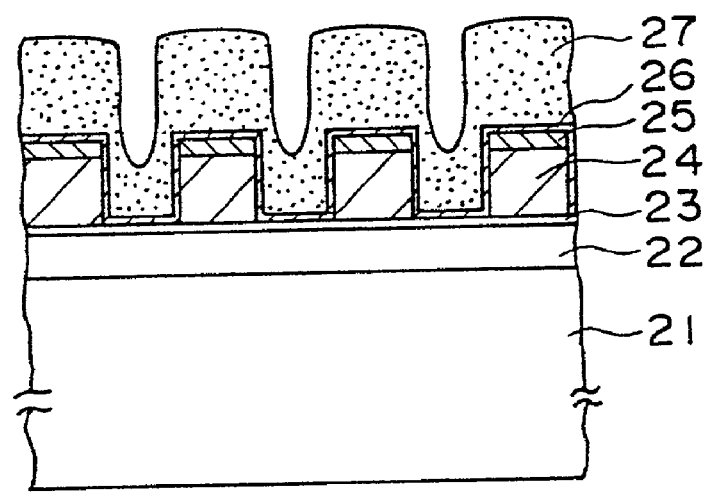
Figure 3F:
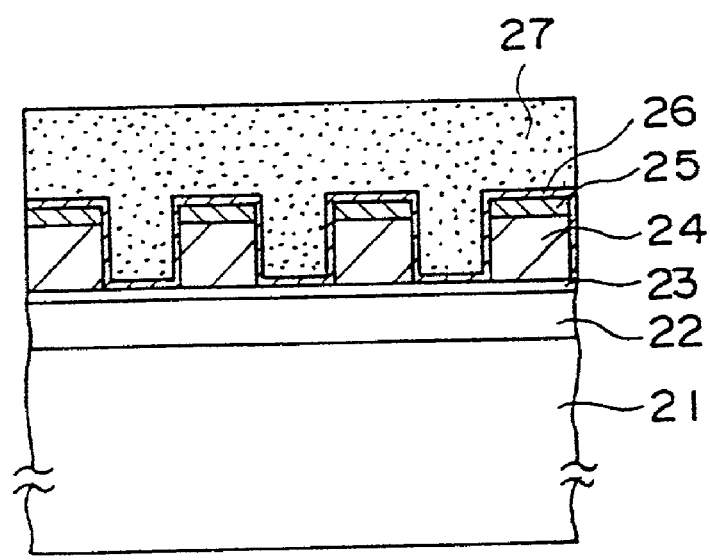
Figure 3G:
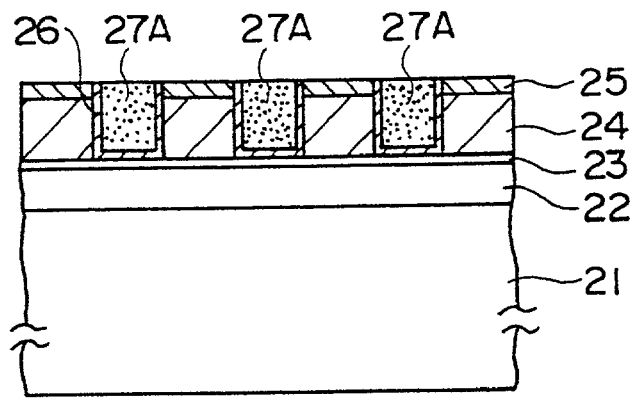
Figure 3H:
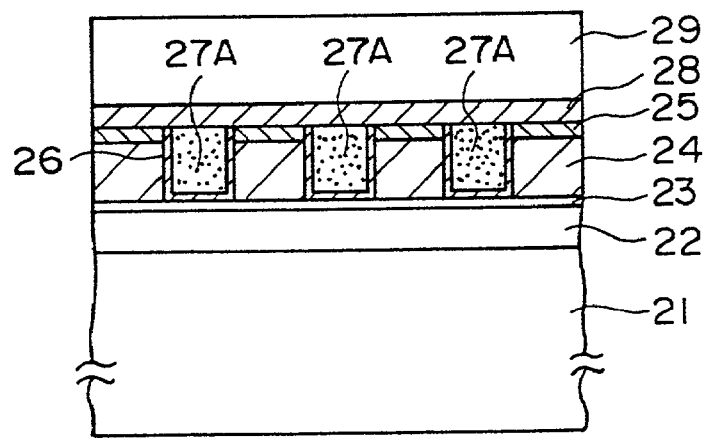
Figure 3I:
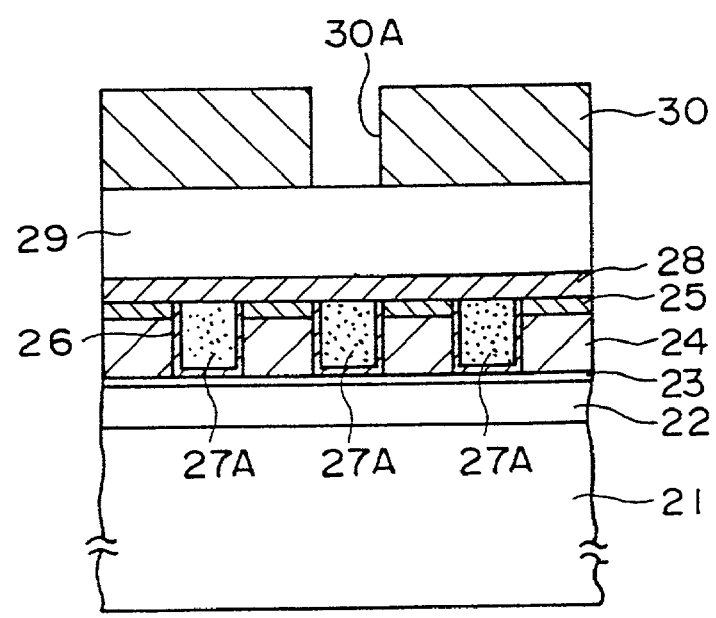
Figure 3J:
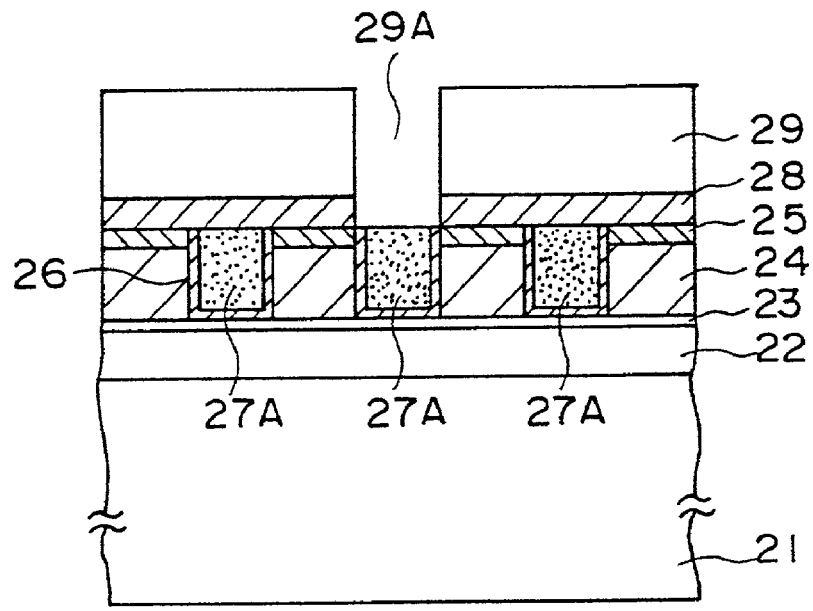
Figure 3K:
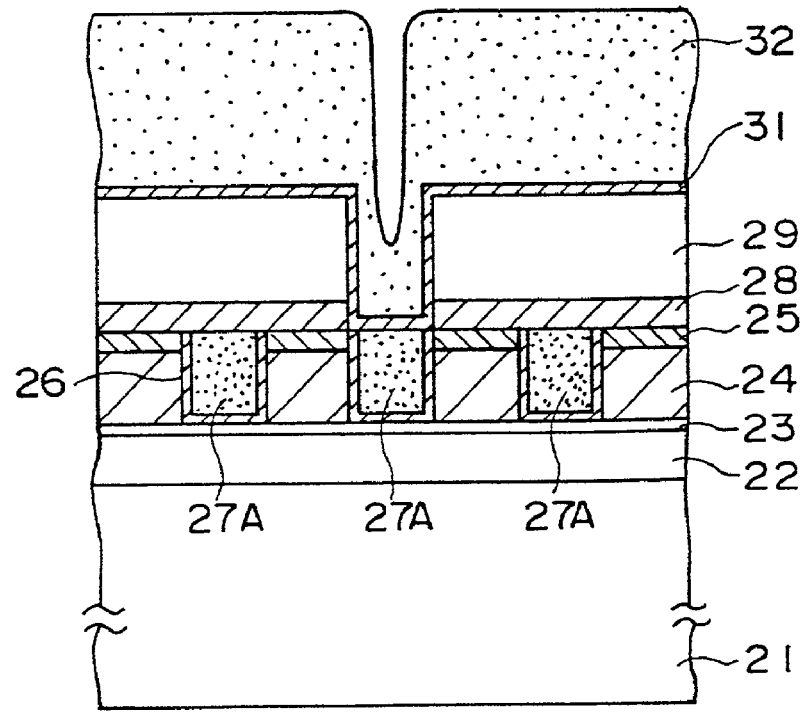
Figure 3L:
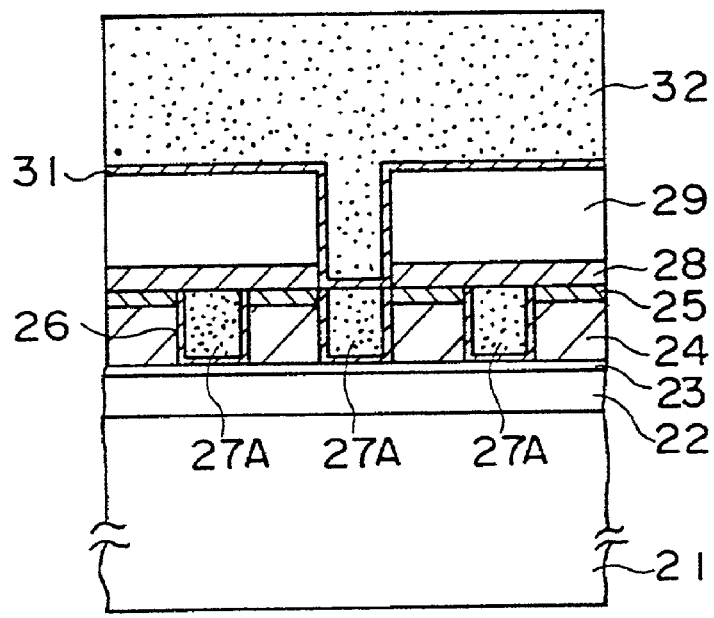
Figure 3M:
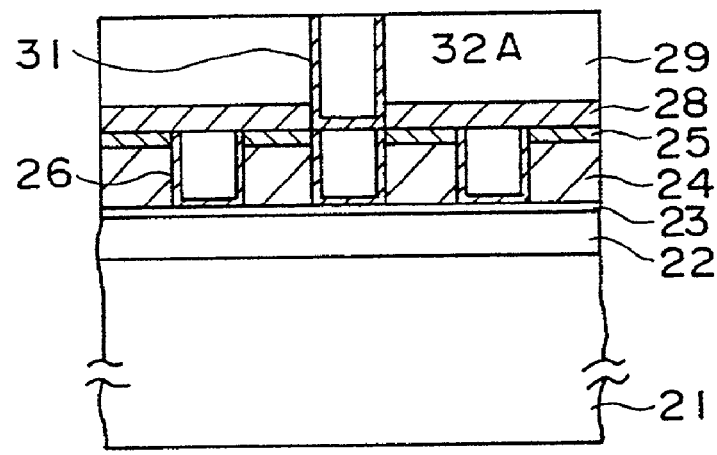
Figure 3N:
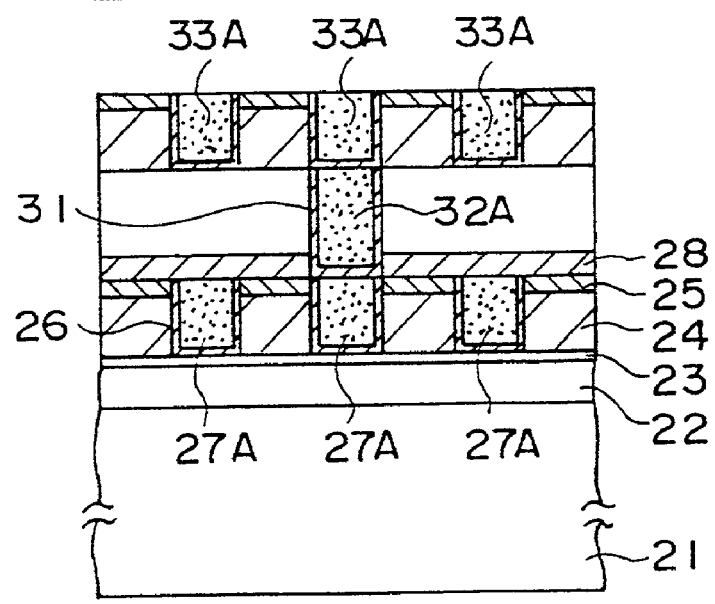

FIGS. 3A–3N are diagrams showing the fabrication process of a semiconductor device according to a first embodiment of the present invention.

Referring to FIG. 3A, an $SiO_2$ film 22 is deposited on a Si substrate 21, on which an active device such as a MOSFET may be formed, by a plasma CVD process with a thickness of about 300 nm, followed by a deposition of an SiN film 23 on the $SiO_2$ film 22 with a thickness of about 50 nm.

Next, in the step of FIG. 3B, an organic interlayer insulation film 24 of an aromatic compound polymer such as the FLARE 2.0 (trade name) of Allied Signal Corp. or a hydrocarbon polymer such as the SiLK of Dow Chemical, Inc., is deposited on the SiN film 23 by a spin-coating process, typically with a thickness of about 400 nm. Further, an organic SOG film 25 is formed on the organic interlayer insulation film 24 by a spin-coating process typically with a thickness of about 50 nm.

In the step of FIG. 3B, the interlayer insulation film 24 and the organic SOG film 25 are further subjected to a curing process together with the underlying substrate 21 and the films 22 and 23, wherein the curing process is conducted in an $N_2$ atmosphere at about 400° C. for about 1 hour. The organic interlayer insulation film 24 thus formed has a low dielectric constant of about 2.8, which is substantially lower than the dielectric constant of an $SiO_2$ film of about 4.1. Further, the organic SOG film 25 thus formed also has a very low dielectric constant of about 3.0.

Next, in the step of FIG. 3C, a resist film 26A is formed on the structure of FIG. 3B, followed by an exposure and developing process to form a number of resist openings 26B in the resist film 26A in correspondence to the conductor pattern to be formed, and a plasma etching process is applied in the step of FIG. 3D to the organic SOG film 25 and the organic interlayer insulation film 24 while using the resist film 24A as a mask. Thereby, it should be noted that the plasma etching process for the organic SOG film 25 is conducted by using a mixture of $CF_4$ and Ar for the etching gas, while the plasma etching process for the organic interlayer insulation film 24 is conducted by using $O_2$ for the etching gas.

In this foregoing patterning process, it should be noted that the resist film 26A is removed in the step of patterning the organic interlayer insulation film 24 as a result of the plasma etching process that uses the $O_2$ etching gas. Even in such a case, the patterning of the organic interlayer insulation film 24 proceeds properly, as the organic SOG film 25 patterned previously by the etching gas of $CF_4$ and Ar has a resistance against oxidation and works as an effective etching mask.

Next, in the step of FIG. 3E, a TiN film 26 is deposited on the structure of FIG. 3D by a sputtering process typically with a thickness of about 50 nm, and a Cu layer 27 is formed on the TiN film 26 by a sputtering process with a thickness of about 800 nm.

Further, in the step of FIG. 3F, the structure of FIG. 3E is processed in a hydrogen atmosphere at about 400° C. for about 5 minutes to induce a reflowing in the Cu layer 27. As a reflowing, the Cu layer 27 fills the groove 24A completely.

Next, in the step of FIG. 3G, the part of the Cu layer 27 above the organic SOG layer 25 is removed by a CMP process that uses a slurry of $Al_2O_3$. More specifically, the CMP process of the Cu layer 27 is conducted by using $H_2O_2$ as an oxidant in combination with the foregoing $Al_2O_3$ slurry while setting the rotational speed of the platen of the polishing apparatus to 60 rpm and the urging pressure to 4.0 psi. By conducting the CMP process under such a condition, the organic SOG film 25 remains substantially unetched as explained with reference to Table 1 before, and the polishing stops spontaneously upon the exposure of the organic SOG film 25. In other words, the organic SOG film 25 works as an effective polishing stopper against the CMP process. In the process of FIG. 3G, it should be noted that the conductor pattern 27A forms a wiring pattern of a damascene structure in which the conductor pattern 27A is embedded in the organic interlayer insulation film 24 and the organic SOG film 25 thereon.

Next, in the step of FIG. 3H, an organic interlayer insulation film 28 having a composition identical with the composition of the organic interlayer insulation film 24 is provided on the structure of FIG. 3G typically with a thickness of about 100 nm by a spin-coating process, followed by a curing process conducted in an atmosphere of $N_2$ at about 400° C. for about 1 hour. Further, an $SiO_2$ film 29 is deposited on the interlayer insulation film 28 by a plasma CVD process with a thickness of typically about 500 nm. The $SiO_2$ film 29 may be formed by an organic SOG film.

Next, in the step of FIG. 3I, a resist film 30 is formed on the $SiO_2$ film 29, wherein the resist film 30 is subjected to exposure and development to form a window 30A.

Next, in the step of FIG. 3J, a contact hole 29A is formed in the $SiO_2$ film 29 by a plasma etching process conducted while using the resist film 30 as a mask, such that the contact hole 29A penetrates through the $SiO_2$ film 29 and the organic interlayer insulation film 28 underneath the $SiO_2$ film 29. In this step of FIG. 3J, a mixture of $CF_4$, $CH_2F_2$ and Ar is used as an etching gas for the plasma etching process of the $SiO_2$ film 29, while a mixture of $O_2$ and Ar is used as an etching gas for the plasma etching process of the organic interlayer insulation film 28. When etching the organic interlayer insulation film 28, the resist film 30 is removed by the etching gas containing $O_2$. Even in such a case, the etching of the organic interlayer insulation film 28 to form the contact hole 29A therein proceeds properly, as the $SiO_2$ film 29 thereon acts as an effective etching mask.

Next, in the step of FIG. 3K, a TiN film 31 is formed on the structure of FIG. 3J by a sputtering process with a thickness of about 50 nm, such that the TiN film 31 covers the side wall of the contact hole 29A. Further, a Cu layer 32 is formed on the TiN film 31 by a sputtering process with a thickness of typically about 1000 nm.

Next, in the step of FIG. 3L, the structure of FIG. 3K is annealed in an atmosphere of $H_2$ at about 400° C. for about 5 minutes, to cause a reflowing in the Cu layer 32, such that the Cu layer 32 fills the contact hole 29A completely. Further, in the step of FIG. 3M, the part of the Cu layer 32 locating above the $SiO_2$ film 29 is removed by a CMP process, to form a conductive plug 32A filling the contact hole 29A. Further, by repeating the steps of FIGS. 3A–3G on the structure of FIG. 3M, a damascene structure shown in FIG. 3N is obtained in which it will be noted that a number of conductor patterns 33A embedded in an organic interlayer insulation film 33 covered by an organic SOG film 34.

Figure 4:
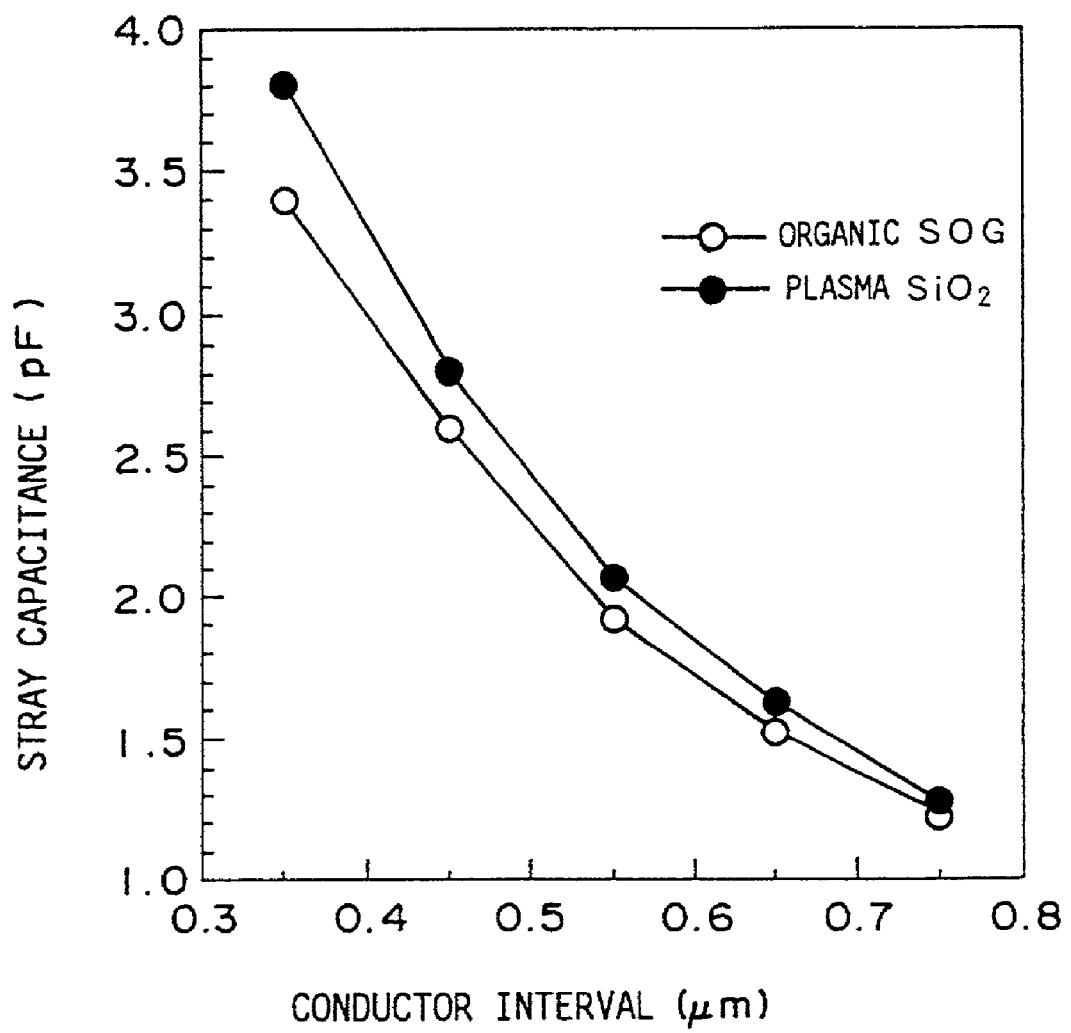
FIG. 4 is a diagram showing the effect of the multilayer interconnection structure of the first embodiment in comparison with a conventional multilayer interconnection structure.

FIG. 4 shows the stray capacitance of the conductor pattern in the multilayer interconnection structure of FIG. 3N for various separation intervals of the conductor patterns, in comparison with a case in which an ordinary plasma-CVD $SiO_2$ film is used in place of the organic SOG film 25 or 34, wherein the open circles represent the result for the case of using the organic SOG film while the solid circles represent the result for the case of using the plasma-CVD $SiO_2$ film. In both cases, it is assumed that the interconnection patterns have a width of 0.4 μm.

Referring to FIG. 4, it can be seen that the stray capacitance of the structure of FIG. 3N represented by the open circles is smaller than the stray capacitance of the conventional case represented by the solid circles and that the difference is pronounced with decreasing separation of the interconnection patterns.

Second Embodiment

As explained with reference to FIGS. 2A–2D, there is a tendency, in a multilayer interconnection structure formed by a damascene process, that a wide conductor pattern undergoes a dishing. When such a dishing is caused, there may be a short circuit in the upper conductor patterns formed above the wide conductor pattern as explained before. Thereby, the yield of semiconductor fabrication is inevitably decreased.

Hereinafter, a fabrication process of a semiconductor device according to a second embodiment of the present invention for eliminating the foregoing problem will be described with reference to FIGS. 5A–5M.

Figure 5A:
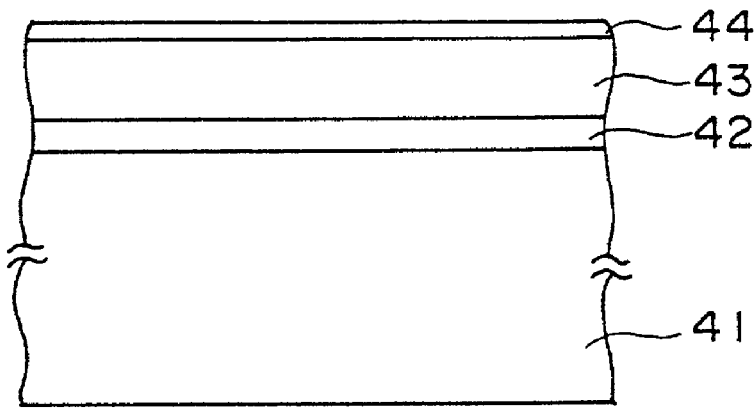
FIGS. 5A–5N are diagrams showing the fabrication process of a semiconductor device according to a second embodiment of the present invention.

Referring to FIG. 5A, an $SiO_2$ film 42 is deposited on a Si substrate 41, on which an active device such as a MOSFET may be formed, by a plasma CVD process with a thickness of about 200 nm, and an organic interlayer insulation film 43 is deposited on the $SiO_2$ film 42 by a spin-coating process typically with a thickness of about 400 nm. The organic interlayer insulation film 43 may be any of an aromatic polymer such as the FLARE 2.0 (trade name) of Allied Signal Corp. noted before or a hydrocarbon polymer such as SILK (trade name) of Dow Chemical, Inc. As noted previously, the organic interlayer insulation film 43 thus formed has a very low dielectric constant of about 2.8 and is suitable for the interlayer insulation film of a high-speed semiconductor device.

In the structure of FIG. 5A, it should be noted that a polishing stopper film 44 of an organic SOG is formed on the organic interlayer insulation film 43 by a spin-coating process with a thickness of typically about 50 nm. Alternately, it is possible to form the foregoing polishing stopper film 44 by a plasma-CVD $SiO_2$ film having a thickness of about 100 nm.

Figure 5B:
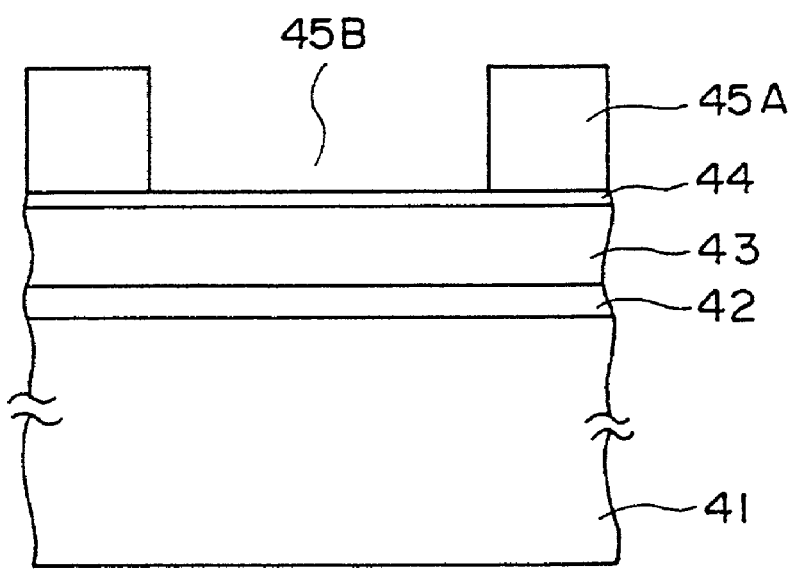
Figure 5C:
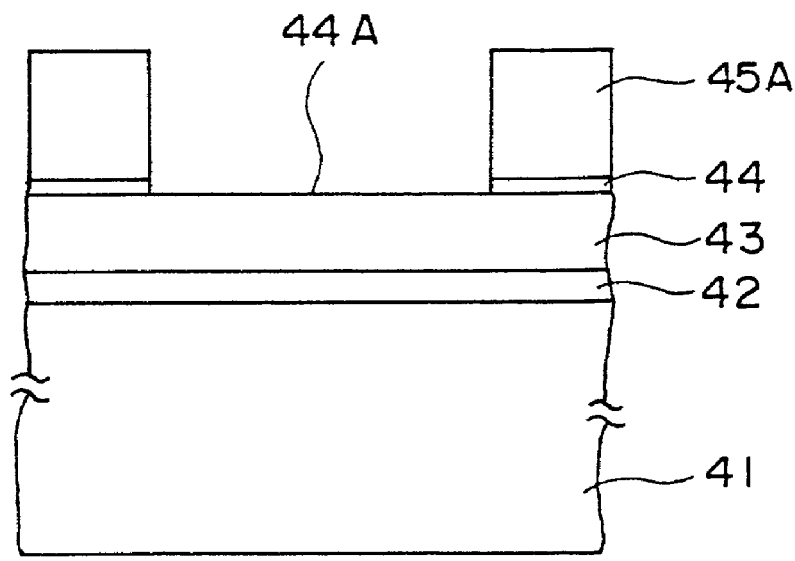

Next, in the step of FIG. 5B, a resist pattern 45A having an opening 45B is formed on the structure of FIG. 5A, and a plasma etching process is conducted in the step of FIG. 5C while using the resist film 45A as a mask, to form an opening 44A in the polishing stopper film 44 in correspondence to the foregoing resist opening 45A. It should be noted that the plasma etching process of the polishing stopper film 44 is conducted by using a mixture of $CF_4$, $CH_2F_2$ and Ar as an etching gas.

Figure 5D:
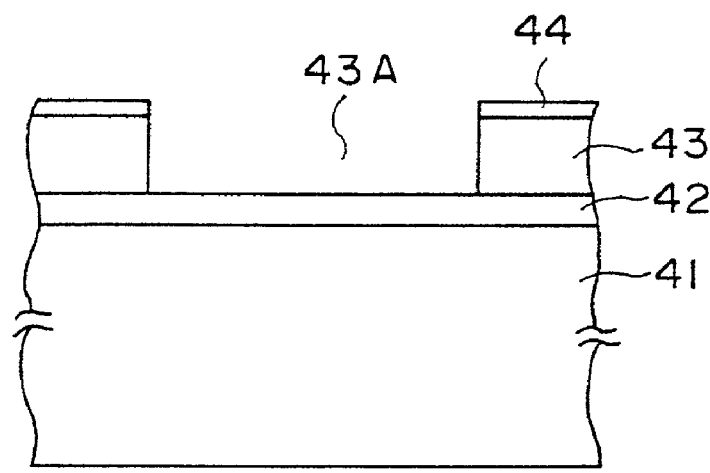

Next, in the step of FIG. 5D, the etching gas is switched to a mixture of $O_2$ and Ar, and the plasma etching process is continued to form an opening 43A in the organic interlayer insulation film 43 in correspondence to the opening 44A while using the polishing stopper film 44 as a mask. It should be noted that the opening 43A thus formed exposes the underlying $SiO_2$ film 42. As a result of the plasma etching process of the organic interlayer insulation film 43 by the etching gas that contains $O_2$, the resist film 45 is removed simultaneously.

Figure 5E:
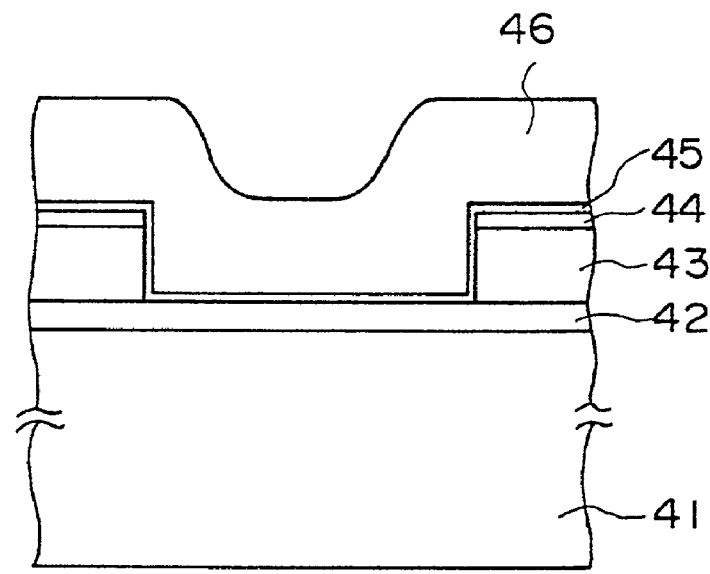

Next, in the step of FIG. 5E, a film 45 of a refractory metal compound such as TiN is deposited on the structure of FIG. 5D by a sputtering process with a thickness of about 50 nm, followed by a further sputtering deposition process of a Cu layer 46 on the TiN film 45 with a thickness of about 800 nm.

Figure 5F:
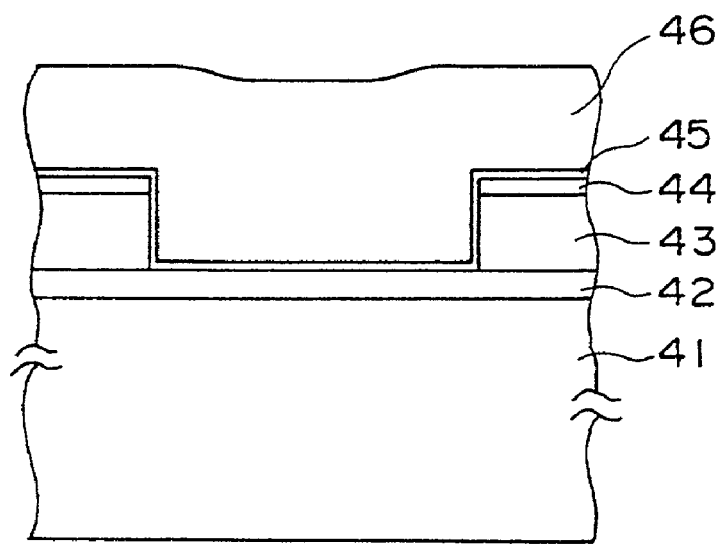
Figure 5G:
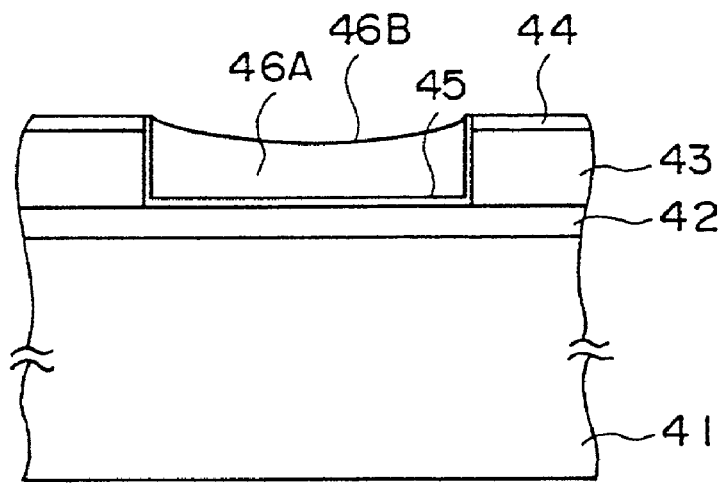

Next, in the step of FIG. 5F, the structure of FIG. 5E is subjected to a thermal annealing process conducted in an atmosphere of $H_2$ at about 400° C. for about 5 minutes under a reduced pressure of about 0.1 Torr, to cause a reflowing in the Cu layer 46. Further, in the step of FIG. 5G, a CMP process is applied to the Cu layer 46 while using $Al_2O_3$ as a slurry and the part of the Cu layer 46 above the polishing stopper film 44 is removed. As explained previously with reference to Table 1, the polishing stopper film 44 of the organic SOG shows an excellent resistance against the polishing, and the CMP process stops spontaneously upon the exposure of the organic SOG film 44 as indicated in FIG. 5G. Of course, it is possible to stop the CMP process with high precision in the state of FIG. 5G upon the exposure of the film 44 when an ordinary plasma-CVD film is used for the polishing stopper film 44. As a result of the CMP process, a Cu pattern 46A filling the opening 43A is obtained as a damascene structure. As explained with reference to FIG. 2B, such a Cu pattern 46A shows a dishing in a surface 46B thereof when the Cu pattern 46A is formed to have an increased width.

Figure 5H:
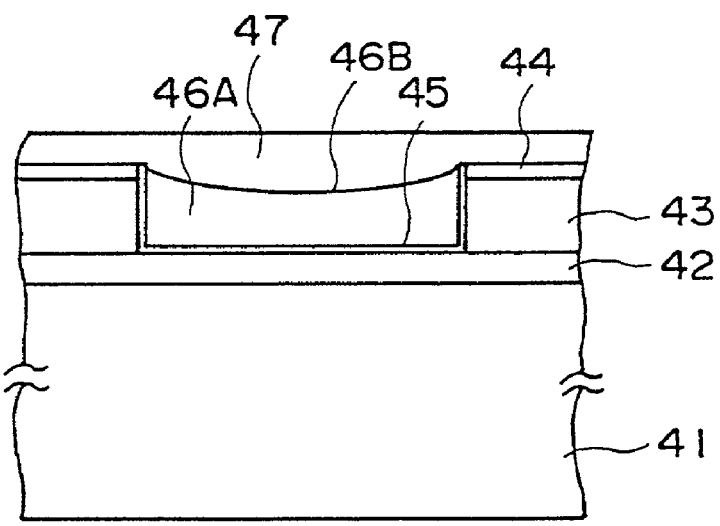
Figure 5I:
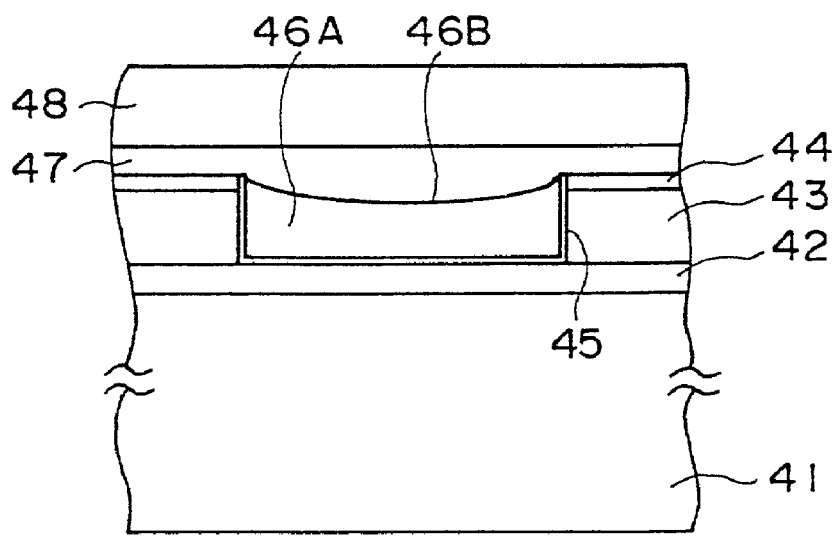

Next, in the step of FIG. 5H, another organic interlayer insulation film 47 is formed on the structure of FIG. 5G by a spin-coating process with a thickness of about 200 nm. Further, an $SiO_2$ interlayer insulation film 48 is formed on the organic interlayer insulation film 47 by a plasma-CVD process with a thickness of about 500 nm. It should be noted that the foregoing organic interlayer insulation film 47 may be formed of an aromatic polymer or a hydrocarbon polymer used for forming the organic interlayer insulation film 43. As the interlayer insulation film 47 is formed by a spin-coating process, the surface of the interlayer insulation film 47 is flat even when there is a dishing in the underlying interconnection pattern 46A. Associated with this, the interlayer insulation film 48 on the interlayer insulation film 47 has a planarized surface.

Figure 5J:
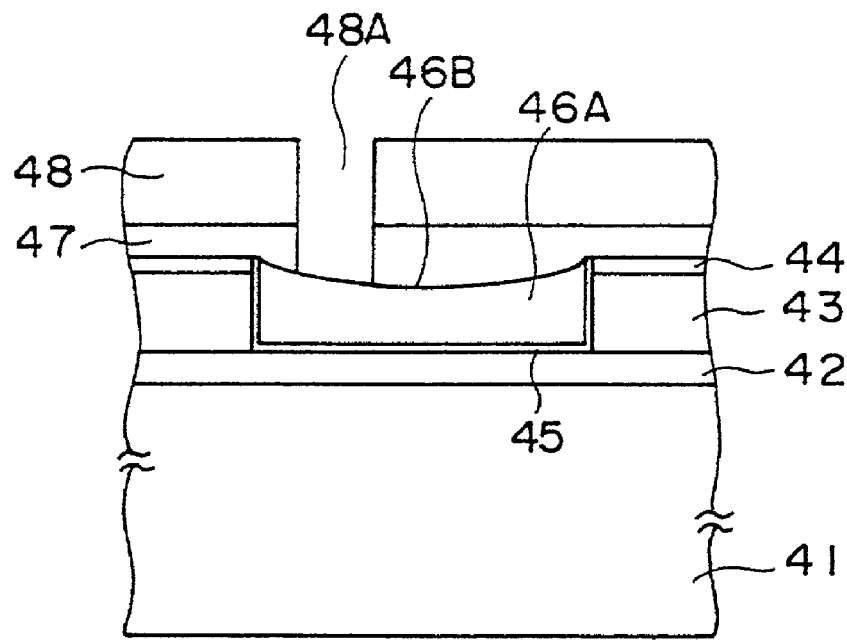
Figure 5K:
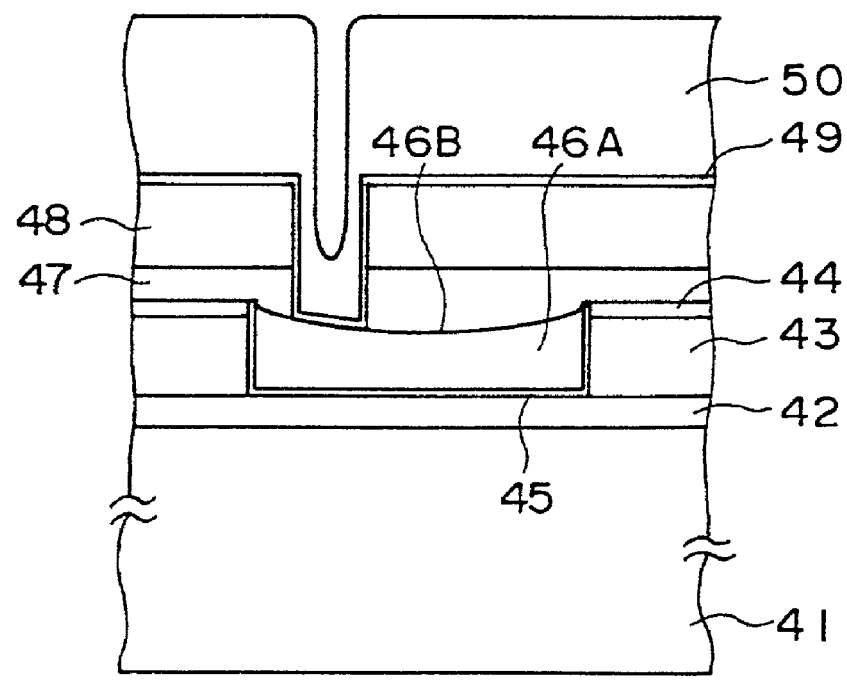

Next, in the step of FIG. 5J, a contact hole 48A is formed through the interlayer insulation film 48 and further through the interlayer insulation film 47 so as to expose the surface 46B of the conductor pattern 46A. Further, a refractory film 49 of a refractory metal compound such as TiN is formed on the structure of FIG. 5J in the step of FIG. 5K typically with a thickness of about 50 nm. After the formation of the TiN film 49, a sputtering process of a Cu layer 50 is conducted also in the step of FIG. 5K with a thickness of about 800 nm. It should be noted that the foregoing step of forming the contact hole 48A is conducted first by applying a plasma etching process to the $SiO_2$ film 48 while using a mixture of $CF_4$, $CH_2F_2$ and Ar as an etching gas, followed by applying a plasma etching process to the underlying organic interlayer insulation film 47 while using a mixture of $O_2$ and Ar as an etching gas.

Figure 5L:
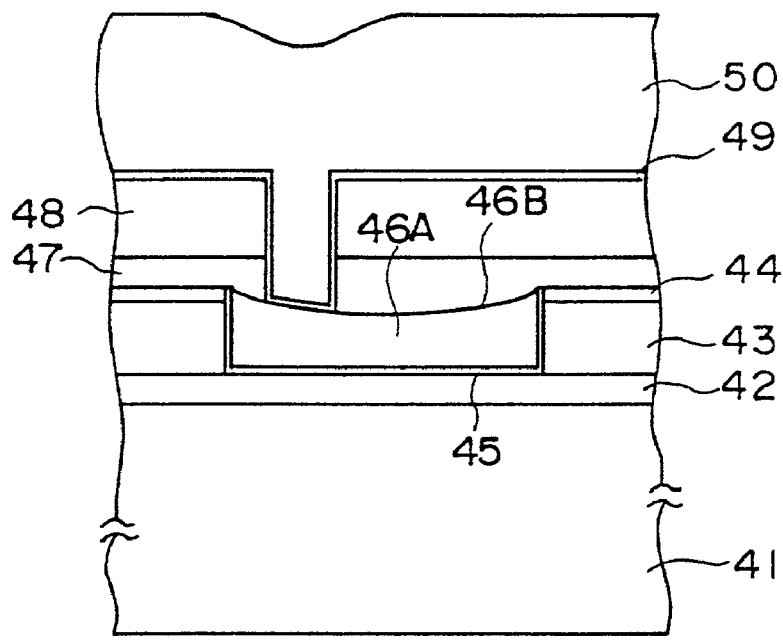

The Cu layer 50 thus formed is then subjected to a thermal annealing process conducted in the step of FIG. 5L at about 400° C. in the atmosphere of $H_2$ under a pressure of about 0.1 Torr for about 5 minutes, wherein the Cu layer 50 thus treated causes a reflowing and fills the contact hole 48A completely.

Figure 5M:
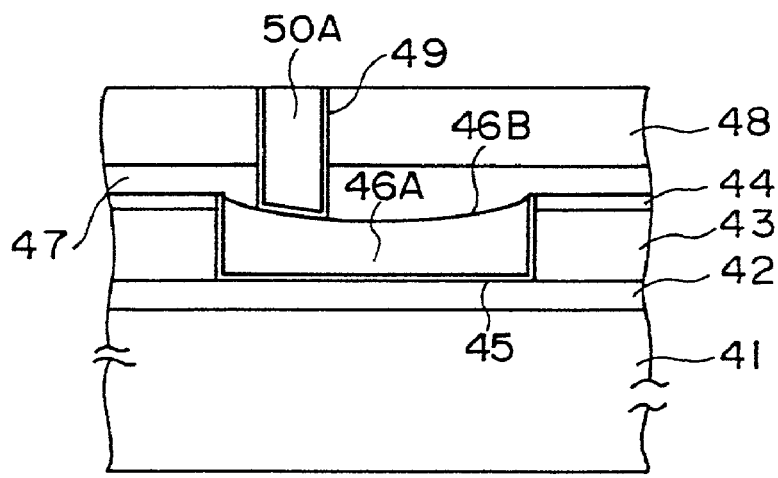

Next, in the step of FIG. 5M, the part of the Cu layer 50 above the $SiO_2$ interlayer insulation film 48 is removed by a CMP process, to form a Cu plug 50A filling the contact hole 48A.

Figure 5N:
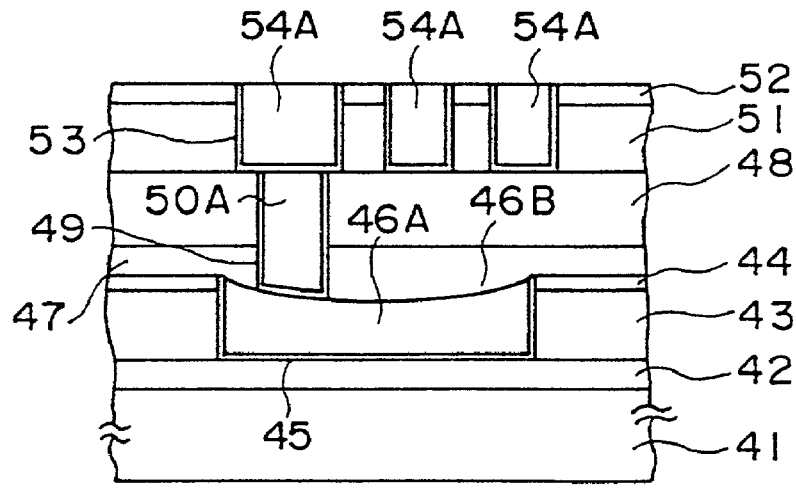

Further, in the step of FIG. 5M, the steps of FIGS. 3A–3G are repeated to form a multilayer interconnection structure represented in FIG. 5N, wherein the multilayer interconnection structure of FIG. 5N includes a number of conductor patterns 54A embedded in an organic interlayer insulation film 51 by a damascene process. In the example of FIG. 5N, it should be noted that the organic interlayer insulation film 51 carries a polishing stopper film 52 of an organic SOG film or a plasma-CVD $SiO_2$ film. In making the structure of FIG. 5N, it is also possible to carry out the steps of FIGS. 5A–5G on the structure of FIG. 5M. In the structure of FIG. 5N, the conductor pattern 54A makes an electrical contact with the underlying conductor pattern 46A via the conductive plug 50A.

In the present embodiment, the conductor pattern 54A is formed on the interlayer insulation film 48 having a planarized surface. Thus, even when there exists a significant dishing in the surface 46B of the underlying conductor pattern 45A, there is no substantial risk that the conductor patterns 54A cause a short-circuit.

In the present embodiment, it should be noted that the conductor pattern 54A may extend in the same direction as the underlying conductor pattern 46A or in a different direction. For example, the conductor pattern 54A may extend perpendicularly to the underlying conductor pattern 46A. Further, it will be noted that the conductor patterns 54A are repeated in the interlayer insulation film 51 with a pitch smaller than a pitch of repetition of the conductor patterns 46A.

Third Embodiment

FIGS. 6A–6H show a fabrication process of a semiconductor device according to a third embodiment of the present invention.

Figure 6A:
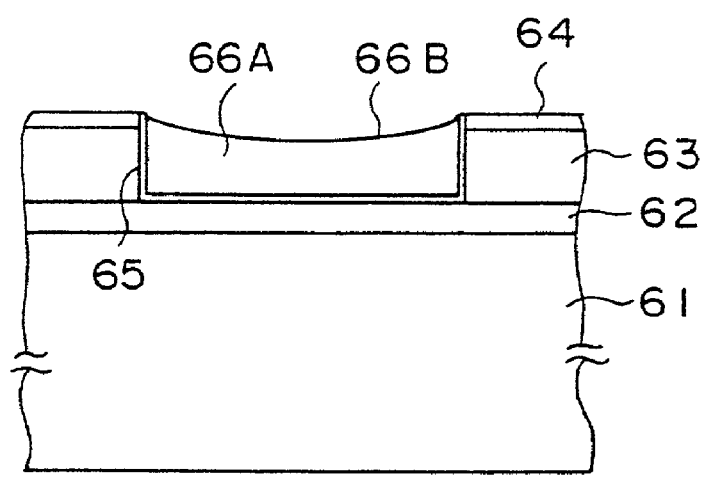
FIGS. 6A–6H are diagrams showing the fabrication process of a semiconductor device according to a third embodiment of the present invention.

Referring to FIG. 6A, the step of FIG. 6A corresponds to the step of FIG. 5G and an organic interlayer insulation film 63 is formed on a Si substrate 61, on which an active device such as a MOSFET is formed, via an intervening $SiO_2$ film 62.

On the organic interlayer insulation film 63, a polishing stopper film 64 of an organic SOG film or a plasma-CVD $SiO_2$ film is provided, and a refractory conductor film 65 of a refractory metal compound such as TiN is provided so as to cover a side wall and a bottom surface of a groove formed in the polishing stopper film 64 and the organic interlayer insulation film 63. Thereby, the groove is filled by a Cu pattern 66A formed in contact with the refractory conductor film 65 by a damascene process including a deposition of a Cu layer and a CMP process thereof, similarly as before. As a result of the chemical mechanical polishing process, a dishing is formed on a surface 66B of the Cu pattern 66A.

Figure 6B:
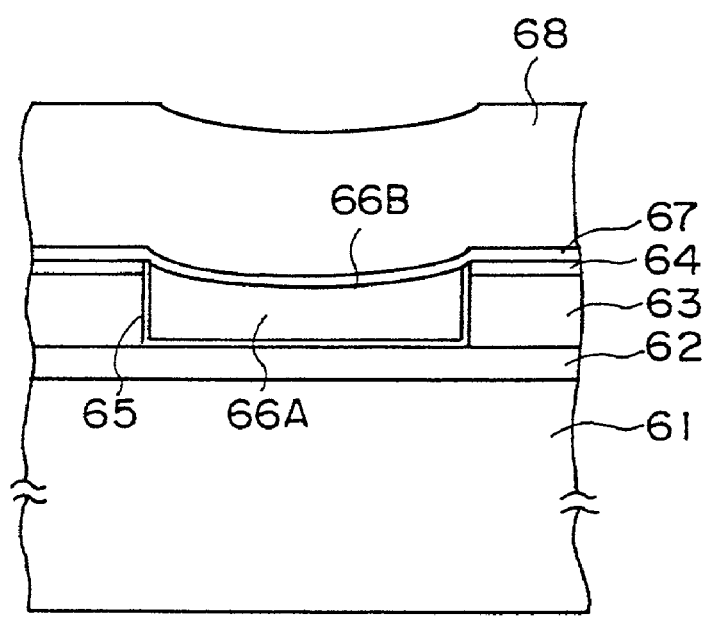

Next, in the step of FIG. 6B, an SiN film 67 is deposited on the structure of FIG. 6A by a plasma-CVD process with a thickness of about 50 nm, and an interlayer insulation film 68 of $SiO_2$ is deposited on the SiN film 67 by a plasma-CVD process with a thickness of about 1000 nm. In the step of FIG. 6B, it should be noted that the SiN film 67 works as a diffusion barrier preventing a diffusion of Cu from the Cu pattern 66A to the $SiO_2$ film 68.

Figure 6C:
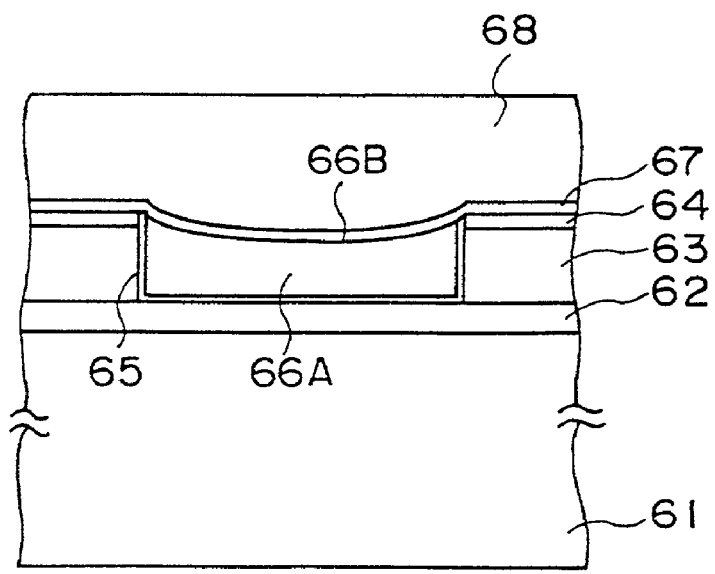

Next, in the step of FIG. 6C, the $SiO_2$ interlayer insulation film 68 of FIG. 6B is planarized by a CMP process that uses a slurry of $SiO_2$. Further, in the step of FIG. 6D, a plasma etching process using a mixture of $CF_4$, $CH_2F_2$ and Ar, is applied to the interlayer insulation film 68 to form a contact hole 68A penetrating through the interlayer insulation film 68 and the underlying SiN film 67 such that the contact hole 68A exposes the surface 66B of the conductor pattern 66A.

Figure 6D:
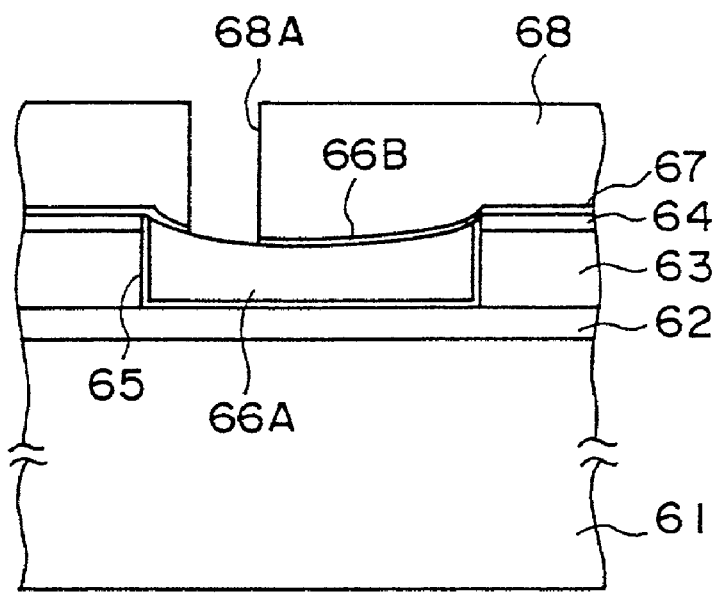
Figure 6E:
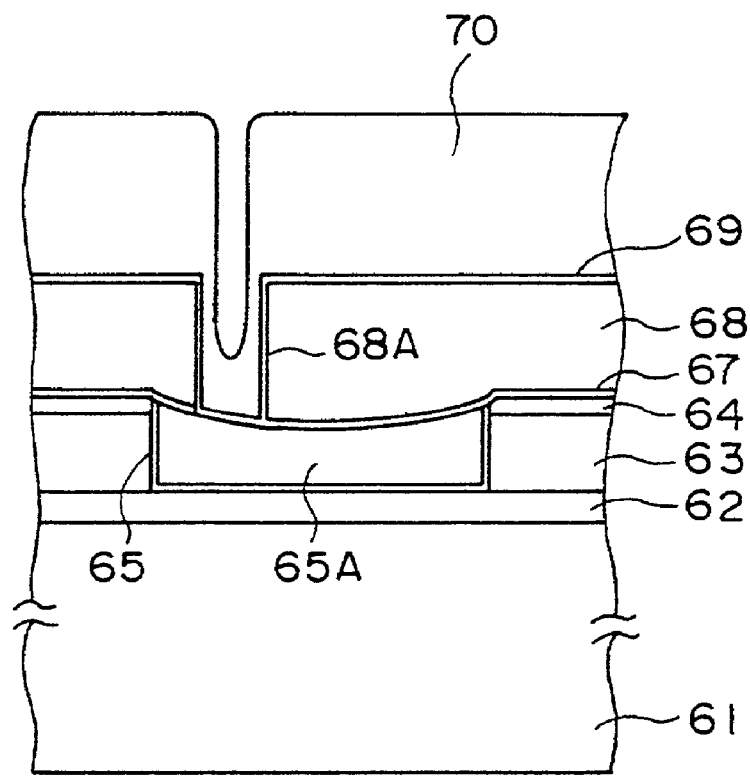

Next, in the step of FIG. 6E, a refractory conductor film 69 of a refractory metal compound such as TiN is deposited on the structure of FIG. 6D by a sputtering process with a thickness of about 50 nm, followed by a sputter deposition of a Cu layer 70 with a thickness of about 800 nm.

Figure 6F:
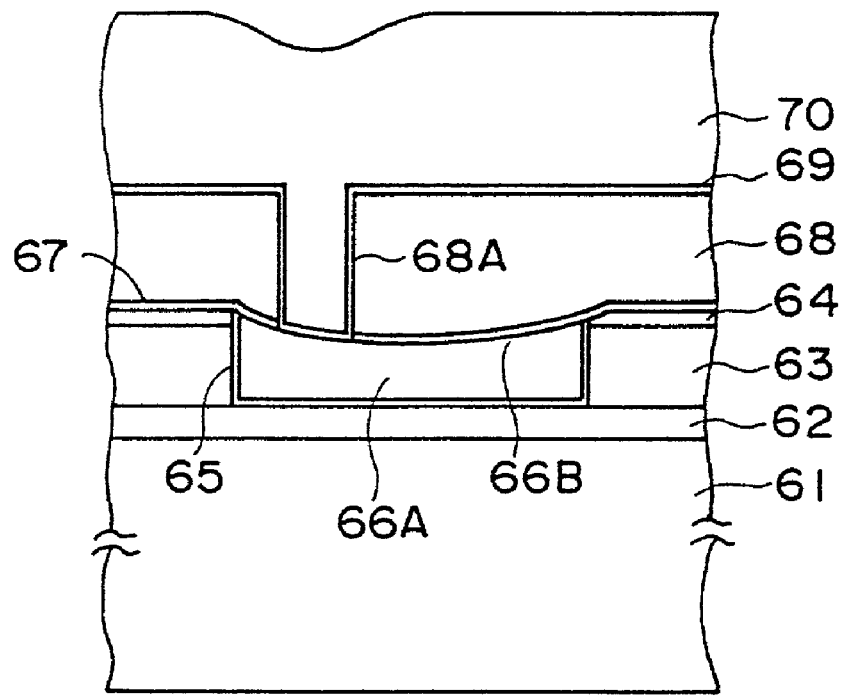
Figure 6G:
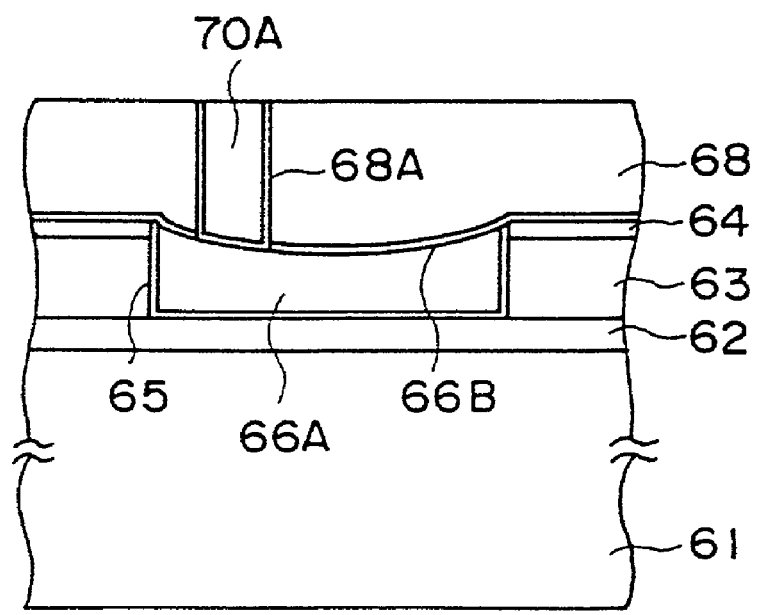

Next, in the step of FIG. 6F, the structure of FIG. 6E is subjected to thermal annealing process conducted in the atmosphere of $H_2$ at about 400° C. for about 5 minutes under a pressure of about 0.1 Torr, to cause a reflowing in the Cu layer 68, followed by a CMP process conducted by using a slurry of $Al_2O_3$ to remove the part of the Cu layer 68 locating above the $SiO_2$ interlayer insulation film 68, to form a Cu plug 70A filling the contact hole 68A. It should be noted that the CMP process of the Cu layer 70 stops spontaneously upon the exposure of the $SiO_2$ interlayer insulation film 68. As a result of the CMP process, the $SiO_2$, interlayer insulation film 68 has a planarized surface irrespective of the dishing in the underlying conductor pattern 66A.

Figure 6H:
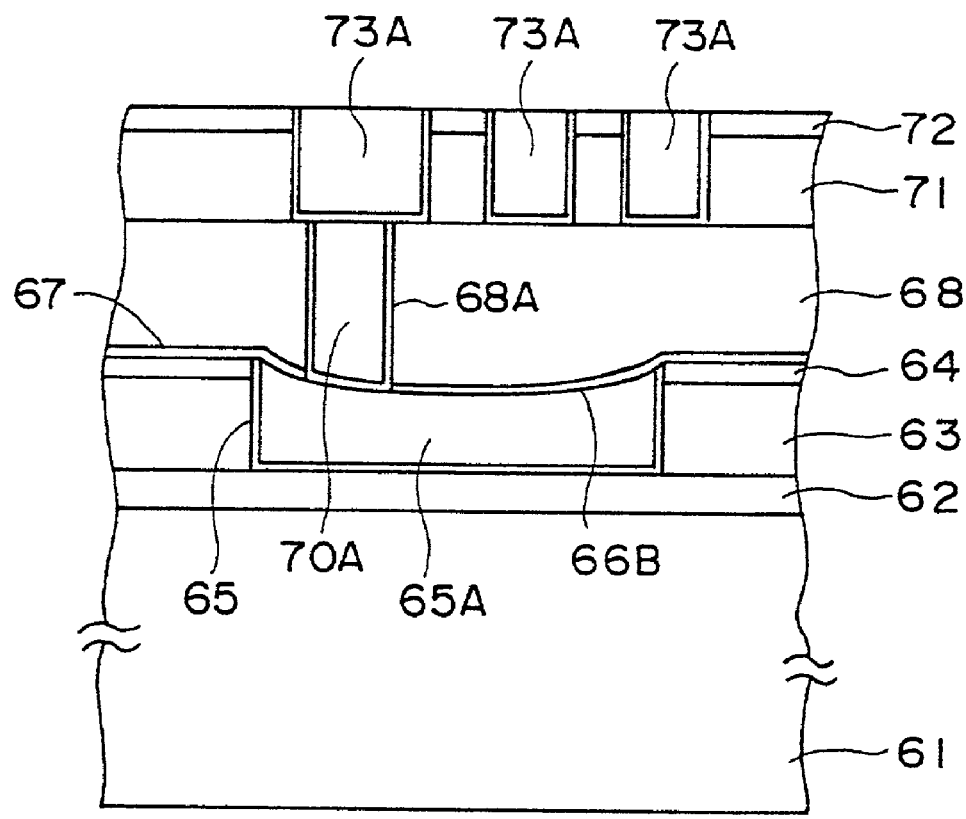

Next, in the step of FIG. 6H, the steps of FIGS. 3A–3G described previously are conducted on the structure of FIG. 6G, and a multilayer interconnection structure including a number of conductor patterns 73A embedded in an organic interlayer insulation film 71 by a damascene process, is obtained. In the example of FIG. 6H, it will be noted that the organic interlayer insulation film 71 carries thereon a polishing stopper film 72 of an organic SOG film or a plasma-CVD $SiO_2$ film.

In the present embodiment, too, the problem of short-circuit of the conductor patterns 73A is effectively avoided by planarizing the interlayer insulation film 68.

Figure 7:
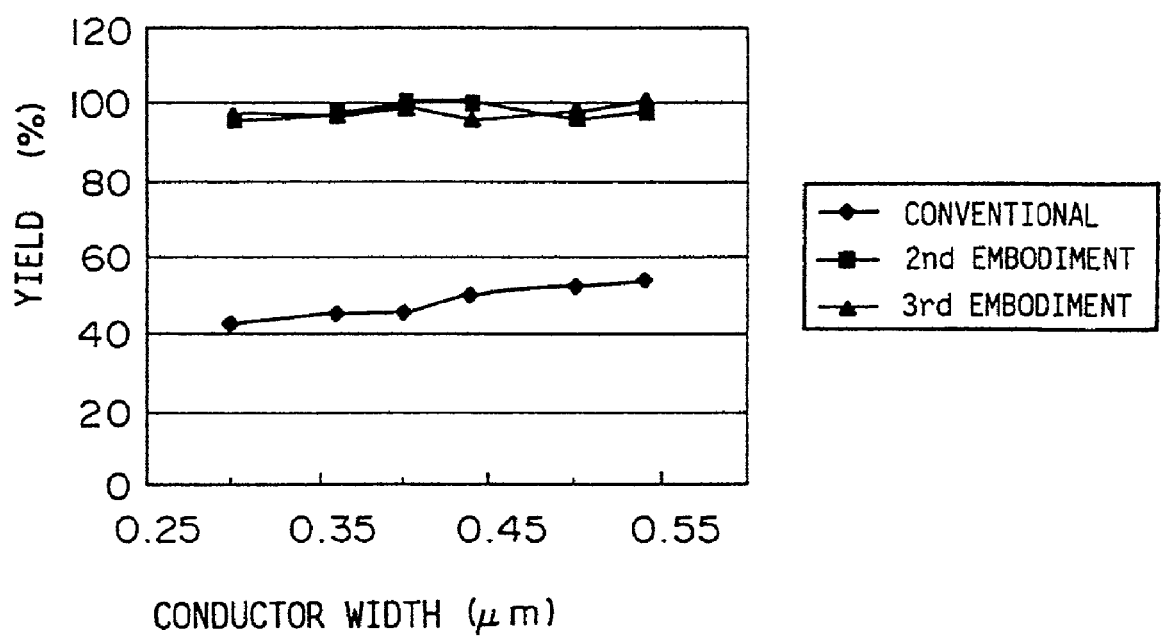
FIG. 7 is a diagram showing the effect of the second and third embodiments of the present invention.

FIG. 7 shows the fabrication yield of the semiconductor device according to the second and third embodiments of the present invention in comparison with the yield for a case in which the same semiconductor device is formed by the conventional process of FIGS. 2A–2D.

Referring to FIG. 7, the conventional yield of 40–50% is increased to almost 100% by employing the present invention. Further, the tendency of decrease of the yield with decreasing width of the conductor patterns is eliminated by employing the present invention.

In the present embodiment, too, the conductor pattern 73A may extend parallel with the underlying conductor pattern 66A or in a direction obliquely to the conductor pattern 66A. For example, the conductor pattern 73A may extend perpendicularly to the conductor pattern 66A. Further, it will be noted that the conductor patterns 73A are repeated in the interlayer insulation film 71 with a pitch smaller than a pitch of repetition of the conductor patterns 65A.

In the embodiments described heretofore, it should be noted that the conductor layer 27 and 32 or 46 and 50 may be formed also by an electroplating process, an electroless plating process, or a CVD process. Further, the conductor layer may be formed also of Al or an Al alloy.

Further, the present invention is not limited to the embodiments described heretofore, but various variations and modifications may be made without departing from the scope of the invention.

The present application is based on Japanese priority application No. 10-75938 filed on Mar. 24, 1998, the entire contents of which are hereby incorporated by reference.

What is claimed is:

1. A semiconductor device comprising:
   a substrate;
   an interlayer insulation film formed on said substrate;
   another insulation film being formed of an organic spin-on-glass formed on said interlayer insulation film;
   a uniform depression penetrating through said another insulation film and reaching said interlayer insulation film; and
   a conductor pattern filling said depression;
   said conductor pattern having a top surface continuous with a top surface of said another insulation film.

2. A semiconductor device as claimed in claim 1, wherein said conductor pattern is formed of Cu.

3. A semiconductor device as claimed in claim 1, wherein said interlayer insulation film is formed of a hydrocarbon polymer compound.

4. A semiconductor device as claimed in claim 1, wherein said interlayer insulation film is formed of an aromatic polymer compound.

5. A semiconductor device as claimed in claim 1, further comprising a conductor film between said depression and said conductor pattern, said conductor film covering said depression in conformity with a shape of said depression.

6. A semiconductor device as claimed in claim 1, wherein said depression penetrates through said interlayer insulation film.

7. A semiconductor device, comprising:
   a substrate;
   a first interlayer insulation film formed on said substrate;
   a first depression formed in said first interlayer insulation film;
   a first conductor pattern filling said first depression, said first conductor pattern having a dishing surface;
   a second interlayer insulation film being formed of an organic spin-on-glass formed on said first interlayer insulation film so as to cover the dishing surface of said first conductor pattern, said second interlayer insulation film having a planarized surface;
   a second depression formed in said second interlayer insulation film; and
   a second conductor pattern filling said second depression.

8. A semiconductor device, comprising:
   a substrate;
   a first interlayer insulation film formed on said substrate;
   a first depression formed in said first interlayer insulation film;
   a first conductor pattern filling said first depression, said first conductor pattern having a dishing surface;
   a second interlayer insulation film formed on said first interlayer insulation film so as to cover the dishing surface of said first conductor pattern, said second interlayer insulation film having a planarized surface;
   a second depression formed in said second interlayer insulation film; and
   a second conductor pattern filling said second depression,
   wherein said second interlayer insulation film includes a first film of an organic insulation film having a planarized top surface, and a second film formed on said first film.

9. A semiconductor device, comprising:
   a substrate;
   a first interlayer insulation film formed on said substrate;
   a first depression formed in said first interlayer insulation film;
   a first conductor pattern filling said first depression, said first conductor pattern having a dishing surface;
   a second interlayer insulation film formed on said first interlayer insulation film so as to cover the dishing surface of said first conductor pattern, said second interlayer insulation film having a planarized surface;
   a second depression formed in said second interlayer insulation film; and
   a second conductor pattern filling said second depression,
   wherein said first conductor pattern is repeated in said first interlayer insulation film with a first pitch, and said conductor pattern is repeated in said second interlayer insulation film with a second pitch smaller than said first pitch.

10. A semiconductor device comprising: a substrate;
    a first interlayer insulation film formed on said substrate;
    a first depression formed in said first interlayer insulation film;
    a first conductor pattern filling said first depression;
    a second interlayer insulation film formed on said first interlayer insulation film so as to cover said first conductor pattern, said second interlayer insulation film having a planarized surface;

a second depression formed in said second interlayer insulation film; and a second conductor pattern filling said second depression, wherein said first conductor pattern extends in said first interlayer insulation film in a first direction and wherein said second pattern extends in said second interlayer insulation film in a second direction different from said first direction.

11. A semiconductor device comprising:

a substrate;

a first interlayer insulation film formed on said substrate;

a first depression formed in said first interlayer insulation film;

a first conductor pattern filling said first depression;

a second interlayer insulation film formed on said first interlayer insulation film so as to cover said first conductor pattern, said second interlayer insulation film having a planarized surface;

a second depression formed in said second interlayer insulation film; and a second conductor pattern filling said second depression, wherein said first conductor pattern extends in said first interlayer insulation film in a first direction and wherein said second conductor pattern extends in said second interlayer insulation film in said first direction.

12. A semiconductor device, comprising:

a substrate;

a first interlayer insulation film formed on said substrate;

a first depression formed in said first interlayer insulation film;

a first conductor pattern filling said first depression, said first conductor pattern having a dishing surface;

a second interlayer insulation film formed on said first interlayer insulation film so as to cover the dishing surface of said first conductor pattern, said second interlayer insulation film having a planarized surface;

a second depression formed in said second interlayer insulation film; and a second conductor pattern filling said second depression, wherein said second interlayer insulation film is an inorganic insulation film having a planarized top surface.

13. A semiconductor device as claimed in claim 12, wherein said second interlayer insulation film comprises a first film conformal to a shape of said first conductor pattern, and a second film formed on said first film, said second film having a planarized top surface.

14. A semiconductor device as claimed in claim 13, wherein said first film comprises an SiN film and said second film comprises an SiO$_2$ film.

* * * * *

UNITED STATES PATENT AND TRADEMARK OFFICE
CERTIFICATE OF CORRECTION

PATENT NO. : 7,041,586 B2 Page 1 of 1
APPLICATION NO. : 10/105190
DATED : May 9, 2006
INVENTOR(S) : Hiroshi Kudo et al.

It is certified that error appears in the above-identified patent and that said Letters Patent is hereby corrected as shown below:

Title Page,
Correct of Item (63), please replace the word "Continuation" with --Divisional --.

Signed and Sealed this

Thirtieth Day of January, 2007

JON W. DUDAS
*Director of the United States Patent and Trademark Office*